(12) United States Patent
Walters et al.

(10) Patent No.: US 7,944,365 B2
(45) Date of Patent: May 17, 2011

(54) SYSTEMS, METHODS, AND APPARATUSES FOR STRAY VOLTAGE DETECTION

(75) Inventors: Jeff Walters, Marshfield, MA (US); Emil Simion, Atlanta, GA (US); Michael Dorogi, Newark, OH (US)

(73) Assignee: ABL IP Holding LLC, Conyers, GA (US)

( * ) Notice: Subject to any disclaimer, the term of this patent is extended or adjusted under 35 U.S.C. 154(b) by 317 days.

(21) Appl. No.: 12/144,090

(22) Filed: Jun. 23, 2008

(65) Prior Publication Data

US 2009/0027281 A1 Jan. 29, 2009

Related U.S. Application Data

(60) Provisional application No. 60/945,529, filed on Jun. 21, 2007.

(51) Int. Cl.
*G08B 21/00* (2006.01)

(52) U.S. Cl. .................. 340/660; 340/661; 340/636.15; 340/635; 340/657; 324/501; 324/500

(58) Field of Classification Search .................. 340/660, 340/661, 635, 635.12, 635.15, 657; 343/703; 324/500, 501, 512, 457
See application file for complete search history.

(56) References Cited

U.S. PATENT DOCUMENTS

| | | | | |
|---|---|---|---|---|
| 4,697,166 A | * | 9/1987 | Warnagiris et al. | 375/258 |
| 5,149,188 A | * | 9/1992 | Robbins | 362/183 |
| 7,449,892 B2 | * | 11/2008 | Wiswell et al. | 324/457 |
| 2007/0085702 A1 | * | 4/2007 | Walters et al. | 340/870.02 |
| 2007/0270114 A1 | * | 11/2007 | Kesler et al. | 455/187.1 |

* cited by examiner

*Primary Examiner* — George A Bugg
*Assistant Examiner* — Hongmin Fan
(74) *Attorney, Agent, or Firm* — Sutherland Asbill & Brennan LLP

(57) ABSTRACT

Systems, methods, and apparatuses may be provided for stray voltage detection. The systems, methods and apparatuses may include providing a first antenna at a first location relative to a monitored equipment or structure, where the first antenna may be operative to detect a first electric field strength at the first location, providing a second antenna at a second location relative to the monitored equipment or structure, where the second antenna may be operative to detect a second electric field strength at the second location, and detecting a stray voltage based at least in part upon the detected first electric field strength and the second electric field strength.

34 Claims, 5 Drawing Sheets

US 7,944,365 B2

SYSTEMS, METHODS, AND APPARATUSES FOR STRAY VOLTAGE DETECTION

RELATED APPLICATION

The present application claims priority to U.S. Provisional Application Ser. No. 60/945,529, filed Jun. 21, 2007, and entitled "SYSTEMS, METHODS, AND APPARATUSES FOR STRAY VOLTAGE DETECTION FOR STREETLIGHT POLES," which is hereby incorporated by reference in its entirety.

FIELD OF THE INVENTION

Aspects of the present invention relate generally to monitoring and detection of stray voltages present in equipment or structures.

BACKGROUND OF THE INVENTION

Stray voltages may include any unwanted, unplanned, and/or spurious voltage. In particular, stray voltages may be present in equipment and/or structures, thereby presenting a potentially dangerous situation for people and/or animals that may come into contact with those equipment and/or structures. Accordingly, there is a need for the detection of stray voltages.

SUMMARY OF THE INVENTION

According to an example embodiment of the invention, there may be a method for stray voltage detection. The method may include providing a first antenna at a first location relative to a monitored equipment or structure, where the first antenna may be operative to detect a first electric field strength at the first location, providing a second antenna at a second location relative to the monitored equipment or structure, where the second antenna may be operative to detect a second electric field strength at the second location, and detecting a stray voltage based at least in part upon the detected first electric field strength and the second electric field strength.

According to another example embodiment of the invention, there may be a system for stray voltage detection. The system may include a first antenna, where the first antenna may be operative to detect a first electric field strength at a first location relative to a monitored object, and a second antenna, where the second antenna may be operative to detect a second electric field strength at a second location relative to the monitored object. The system may also include a signal processing device operative to determine a stray voltage based at least in part on the detected first electric field strength and the second electric field strength.

BRIEF DESCRIPTION OF THE DRAWINGS

Reference will now be made to the accompanying drawings, which are not necessarily drawn to scale, and wherein.

DETAILED DESCRIPTION OF THE INVENTION

The present invention will now be described more fully hereinafter with reference to the accompanying figures, in which like numerals indicate like elements throughout the several drawings. Some, but not all embodiments of the invention are described. Indeed, these inventions may be embodied in many different forms and should not be construed as limited to the embodiments set forth herein; rather, these embodiments are provided so that this disclosure will satisfy applicable legal requirements, be thorough and complete, and will fully convey the scope of the invention to those skilled in the art.

Example embodiments of the invention may provide for the detection of stray voltages for monitored equipment and structures. According to an example embodiment of the invention, the stray voltages may include any unwanted, unplanned, and/or spurious voltages. In accordance with example embodiments of the invention, a variety of equipment and structures may be monitored for stray voltages, including, but not limited to, streetlight poles and associated mounting hardware, manhole covers, fences, surface mount transformers, guide wires, conductive or metal covers and grates (e.g., grates located on sidewalks), and other equipment or structures that may include conductive and/or metal components. Accordingly, it will be appreciated that while stray voltage detection may be illustrated with respect to streetlight poles, the systems, methods, and apparatuses described herein may be applicable to stray voltage detection in a variety of other applications.

Figure 1A:
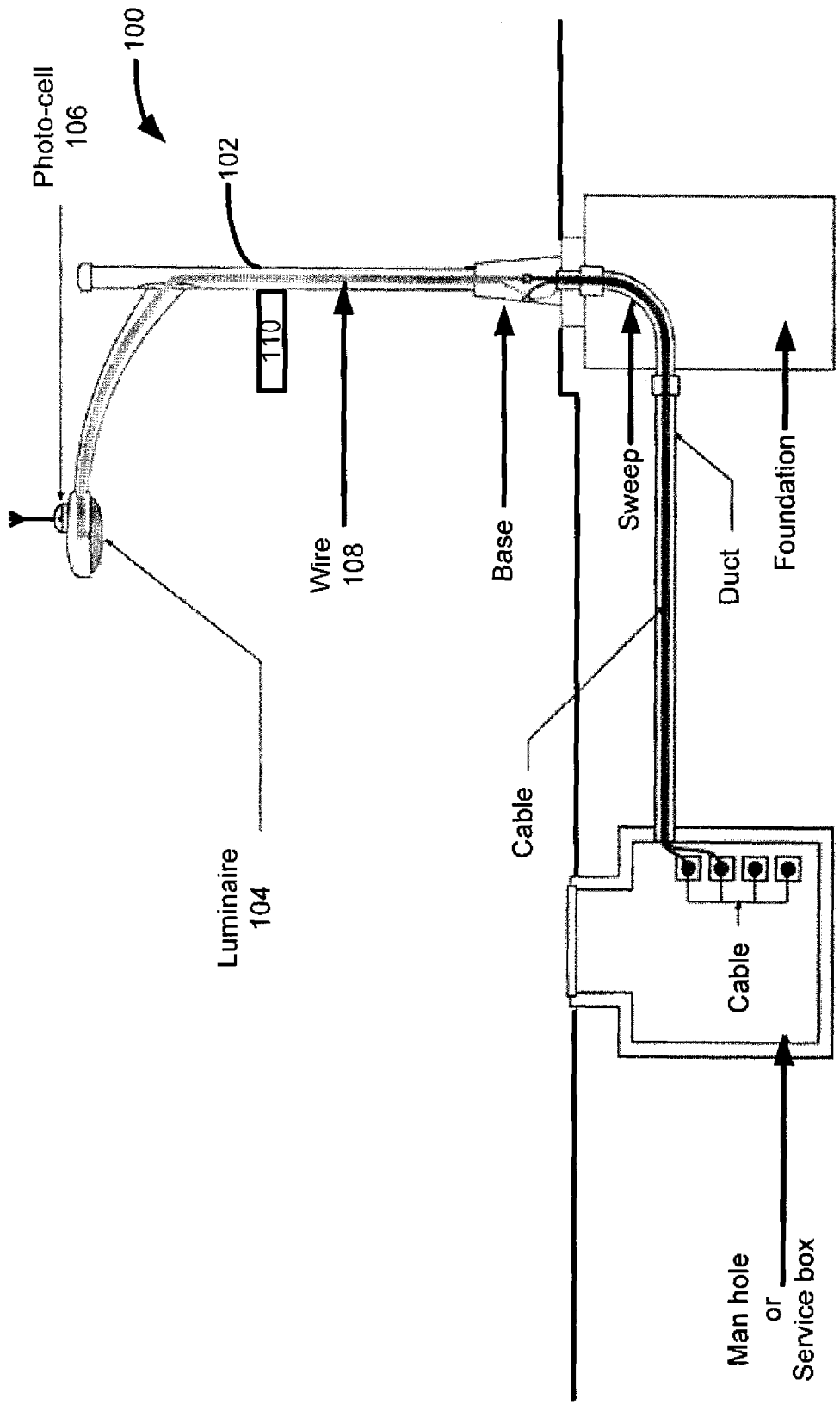
FIG. 1A illustrates an overview of a system for detecting stray voltages of streetlight poles, according to an example embodiment of the invention.

FIG. 1A illustrates an overview of a system for detecting stray voltages associated with streetlight poles, according to an example embodiment of the invention. As illustrated in FIG. 1A, there may be a streetlight 100 that may include at least one luminaire 104. The luminaire 104 may be monitored and controlled by a photocontrol device 106. The photocontrol device 106 may include a detection device and/or photocell for monitoring and/or determining a status or condition (e.g., ON, OFF, alerts such as cycling, luminaire out, etc.) of the luminaire 104. In addition, the photocontrol device 106 may also include means for communicating the monitoring, status, alert, and/or location information (e.g., global positioning system (GPS) coordinates associated with photocontrol device 106) with external sources such as a remote station or remote user. The communication means may include an RF/wireless transceiver, a power line carrier transceiver, or another wireless or wired communications device. According to an example embodiment of the invention, the photocontrol device 106 may use a power line carrier transceiver to communicate with an external source such as a remote station. On the other hand, the photocontrol device 106 may communicate with an external source via a RF/wireless network. As an example the wireless network may be formed of one or more neighboring photocontrol devices and/or gateway devices that comprise a mesh network. According to an example embodiment of the invention, the photocontrol device 106 may be similar to the intelligent luminaire managers disclosed in U.S. Patent Publication No. 2007/0085702, filed Sep. 11, 2006, and entitled "Light management system having networked intelligent luminaire managers," which is hereby incorporated by reference. For example, the patent publication discloses the following:

> A light management system having networked intelligent luminaire managers. A plurality of networked luminaire managers, each collocated with a respective luminaire, monitor the status of their respective luminaires. The luminaire managers include transmitters for transmitting status information about their respective luminaires such as, for example, a lamp out condition upon occurrence of such a lamp out condition, to a network server. The network server forwards the received status information from the networked luminaire managers to a computer of an owner/operator of the plurality of luminaires. The luminaire managers communicate with each other, whereby they form a network.

It will be appreciated, however, that other variations of the photocontrol device 106 may likewise be available in other example embodiments of the invention.

During operation of the streetlight 100, the luminaire 104 may be enabled and/or powered via one or more wires 108. According to an example embodiment of the invention, the one or more wires 108 may include a LINE wire, a NEUTRAL wire, and a GROUND wire. These wires 108 may be housed within the casing 102 of the streetlight 100. In one embodiment, the wires 108 may routed from the bottom of the streetlight 100 through the casing 102 to the luminaire 104. However, according to an alternative embodiment of the invention, the wires 108 may be routed from the top of the streetlight 100 through the casing 102 to the luminaire 104. With reference to the wires 108, the LINE wire and NEUTRAL wire may provide power to the luminaire 104 at a particular voltage and current, perhaps in the range of 120/208/277/480 VAC at 50/60 Hz, according to an example embodiment of the invention. However, it will be appreciated that the voltage, current, and/or frequency may be varied based upon the available power supply and the operational characteristics of the streetlight, including the luminaire 104. For example, the luminaire 104 may operate at up to 400 watts HPS, and accordingly, the voltage and current levels provided via the LINE wire and NEUTRAL wire may need to be selected appropriately. In some 240 or 480 volt circuits they may be two LINE wires and no neutral, according to an example embodiment of the invention. These wires may be one possible source of stray voltage, but it will be understood that stray voltages may be provided from other sources as well.

Still referring to FIG. 1A, an existing streetlight 100 or a newly manufactured streetlight 100 may be retrofitted with, outfitted with, or otherwise provided with a voltage detection device 110. The voltage detection device 110 may be operative to detect electrical problems, including stray voltage problems associated with the streetlight 100. For example, the stray voltage problems may be associated with the wires 108 housed within the casing 102, or any other electrical source. Indeed, since the casing 102 of the streetlight 100 may metallic and thereby conductive, electrical problems with the wires 108 may result in stray voltages being transferred to the casing 102. Likewise, the stray voltages in the casing 102 may occur from a variety of sources independent from the wires 108 housed within the casing 102. Irrespective of the source, these stray voltages may present dangerous and potentially deadly conditions to an animal or person who comes into contact with the casing 102.

If the voltage detection device 110 detects a stray voltage or another electrical problem, it may provide an alert. In other embodiment, the alert may be provided to the photocontrol device 106 for transmission via a network to a remote location such as a remote center or a remote user, perhaps via a handheld device such as a PDA, cell phone, and the like. The information transmitted to the remote center and/or remote user may include an indication of the stray voltage, an identifier associated with the voltage detection device 110 or photocontrol device 106 (e.g., MAC ID), and/or location information such as GPS coordinates associated with the detected stray voltage. As described herein, the transmission network may be a wired or wireless network, including a power-line carrier network or a mesh network formed by a plurality of photo-cell devices 106 in communication with each other and one or more gateway devices that communicate with an operating center. According to another embodiment of the invention, the alert may be provided locally, perhaps as a blinking light or audible signal (to humans) that indicates a problem. Alternatively, the alert may also be a constant light or an inaudible signal (to humans). In any case, a utility worker may be dispatched when the alert is received and/or noticed.

It will be appreciated that while the voltage detection device 110 has been discussed with respect to a detected stray voltage, other alerts may be provided by the voltage detection device 110 as well. For example, additional sensors or detectors may be provided within the voltage detection device 110 so that the device 110 is able to provide alerts relating to one or more of the following, which include but are not limited to: (i) high or low temperature, (ii) gunshot or other distinct noise, (iii) carbon monoxide, (iv) sewer gas, (v) defect in circuitry of voltage detection device 110, (vi) tampering or other attempts to open detection device 110, (vii) radiation, (vii) environmental conditions, such as air quality and/or carbon dioxide levels. These and other alerts may also be provided to a remote location (e.g., wirelessly or by wired connection) or locally (e.g., blinking light, non-blinking light, audible noise, etc.), as similarly described above.

Figure 1B:
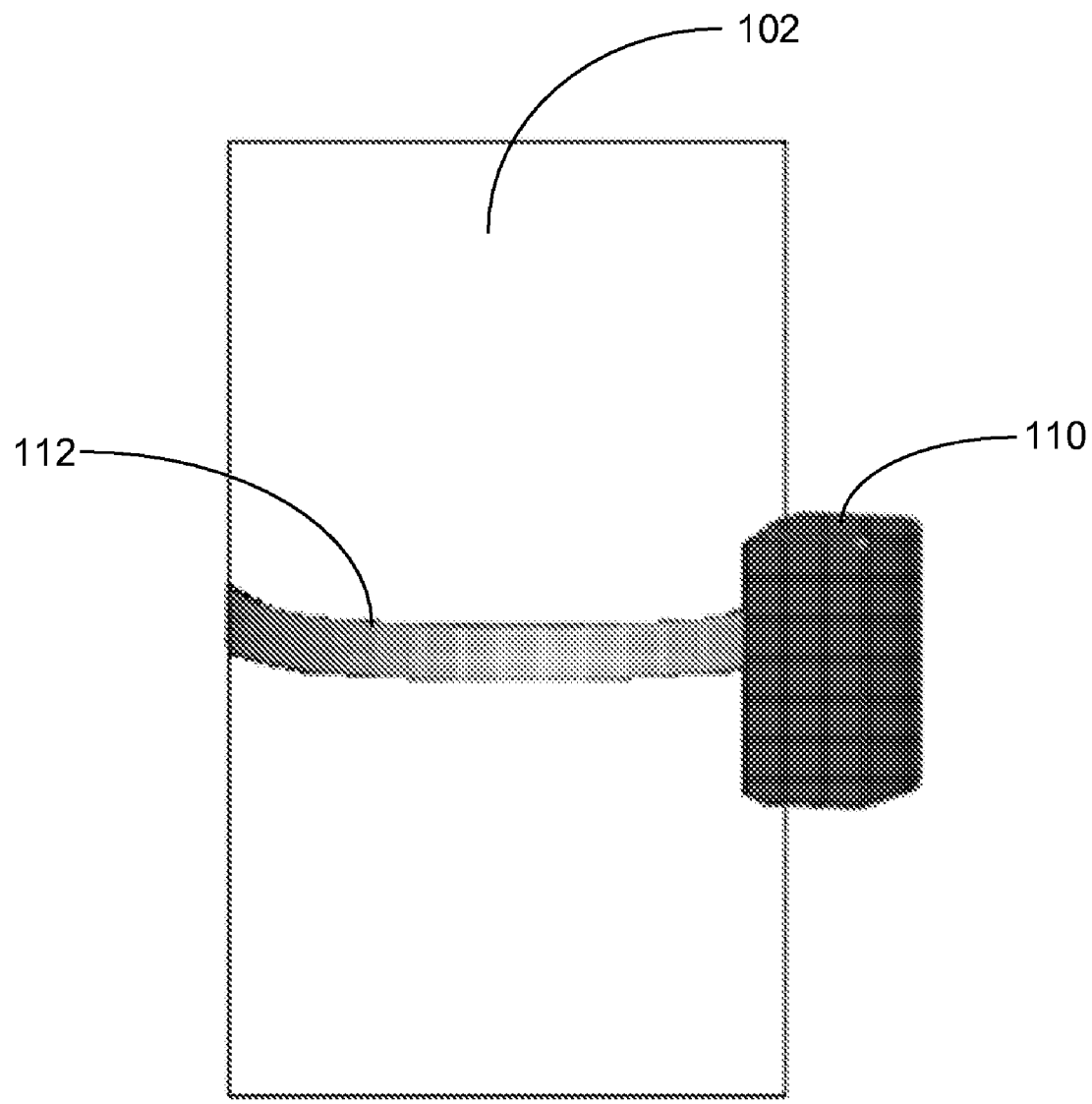
FIG. 1B illustrates an example of a stray voltage detection device, according to an example embodiment of the invention.

FIG. 1B illustrates a voltage detection device 110 that has been provided for a streetlight 100, according to an example embodiment of the invention. According to an embodiment of the invention, the voltage detection device 110 may be provided with an outer casing such as an outdoor weatherproof, non-conductive enclosure. It will be appreciated that the voltage detection device 110 may be its own separate device or incorporated as part of another device or common enclosure. For example, the voltage detection device 110 may be incorporated as part of the photocontrol device 106, the luminaire 104, or another fixture head, according to an example embodiment of the invention.

The voltage detection device 110 may be mounted using a variety of mechanisms. In FIG. 1B, a clamp such as a band clamp may be used to mount the voltage detection device 110 to the metal pole of the casing 102. Other mechanisms may include adhesives (e.g. epoxies, double-side tape), welding, slotted connections, clips, screws, bolts, and the like. According to an embodiment of the invention, the voltage detection device 110 may be mounted at certain distance from the ground, perhaps at least 8 feet vertically, to discourage tampering and other contact of the mounted device 110. It will be appreciated that while the voltage detection device 110 may likewise be mounted on a handhole near or in the base of the streetlight 100 or on a mast arm of the streetlight 100. According to yet another embodiment of the invention, the voltage detection device 110 may be provided near or within the photocontrol device 106. Indeed, it will be appreciated that the voltage detection device 110 may be provided in various locations around or near the casing 102 without departing from embodiments of the invention. As an example, the voltage detection device 110 may be near or within the luminaire 104 and/or the luminaire ballast as well.

It will be appreciated that while FIGS. 1A and 1B disclose the use of the voltage detection device 110 with a streetlight 100, the voltage detection device 110 could be utilized with a variety of other equipment and structures. As an example, the voltage detection device 110 may be used to detect stray voltages in subway, trolley cars, and other similar transportation systems. For example, subways and trolley cars may operate with 600 VDC power systems that may contribute to stray voltages. Additionally, the voltage detection device 110 may be used to detect stray voltages in constant current transformers used for series roadway lighting. Likewise, the voltage detection devices 110 may be utilized for other metallic or conductive objects, including manhole covers, fences, surface mount transformers, guide wires, conductive or metal covers and grates, and the like. As similarly described herein, the voltage detection device 110 may likewise include or otherwise be provided communication means for providing alerts regarding detected stray voltages. Indeed, the alerts may be local alerts, such as blinking or non-blinking and noise) or transmitted alerts, including those provided through a power-line network or a wireless network to a remote center or a remote user.

Figure 2A:
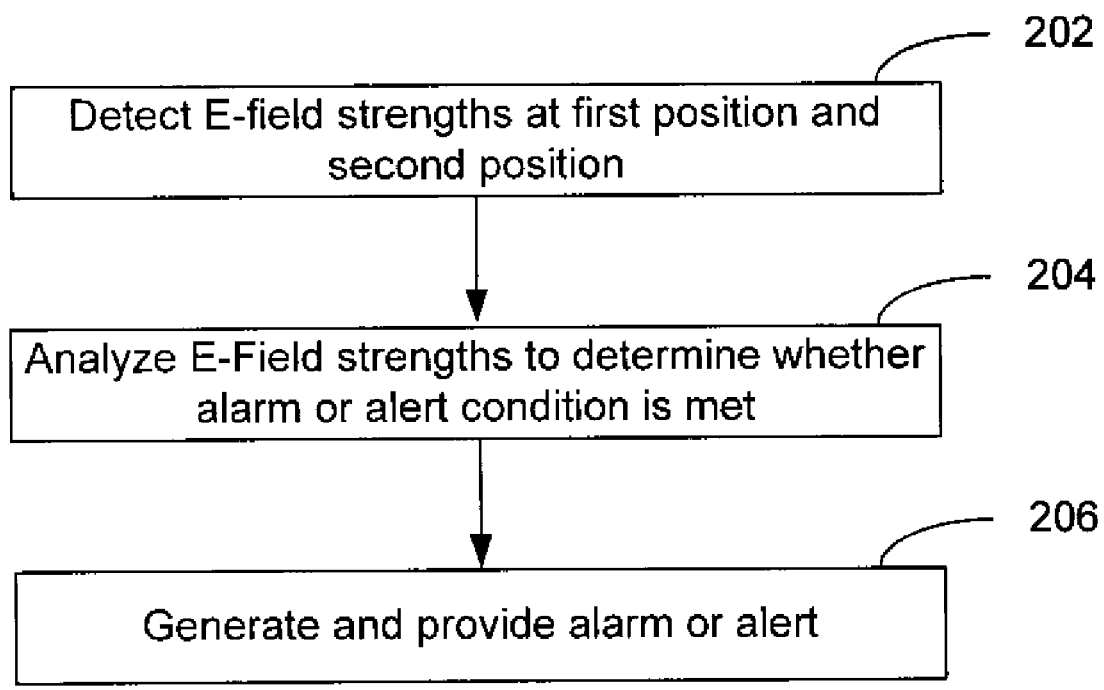
FIG. 2A illustrates an example circuit diagram for a stray voltage detection device, according to an example embodiment of the invention.

FIG. 2A describes an example method for detecting stray voltages, according to an example embodiment of the invention. In block 202, the voltage detection device 110 may detect electric field (E-fields) strengths at two or more locations or positions. For a streetlight 100, a first position may be at or near the casing 102 (e.g., at the streetlight pole end) while a second position may be further away from the casing 102 (e.g., the opposite end). As another example, for a manhole cover, a first position may be near a top surface of the manhole cover while a second position may be near a bottom surface of the manhole cover, according to an example embodiment of the invention. Alternatively, for a manhole cover, the first position and the second position may on the same side of the manhole cover (e.g., top or bottom), except the second position may be further from a surface of the manhole cover than the first position. In yet another example, for a metal fence, the first position may be at a left (or top) side of the fence while the second position may be at a right (or bottom) side of the fence. Many variations of the first and second positions, and yet other additional positions, may be available depending on the equipment or structure that may be monitored.

In block 204, the voltage detection device 110 processes and analyzes the detected E-field strengths at each position to determine whether any alarm or alert conditions have been met. According to an example embodiment of the invention, block 204 may include comparing information obtained from the E-fields strengths at two or more positions to one or more thresholds to determine an alert or alarm condition associated with a detected stray voltage. As an example, a difference between E-field strengths at two positions may be compared to a threshold to determine the alarm or alert condition.

In block 206, the alarm or alert may be generated and provided or transmitted as appropriate. For example, the alarm or alert may be transmitted from the voltage detection device 110 to the photocontrol device 106, which may provide the alarm or alert to a remote location or remote user via a wired or wireless network, as described above. Alternatively, the alarm or alert could also be provided locally by the voltage detection device 110, perhaps as a light or noise alert.

Figure 2B:
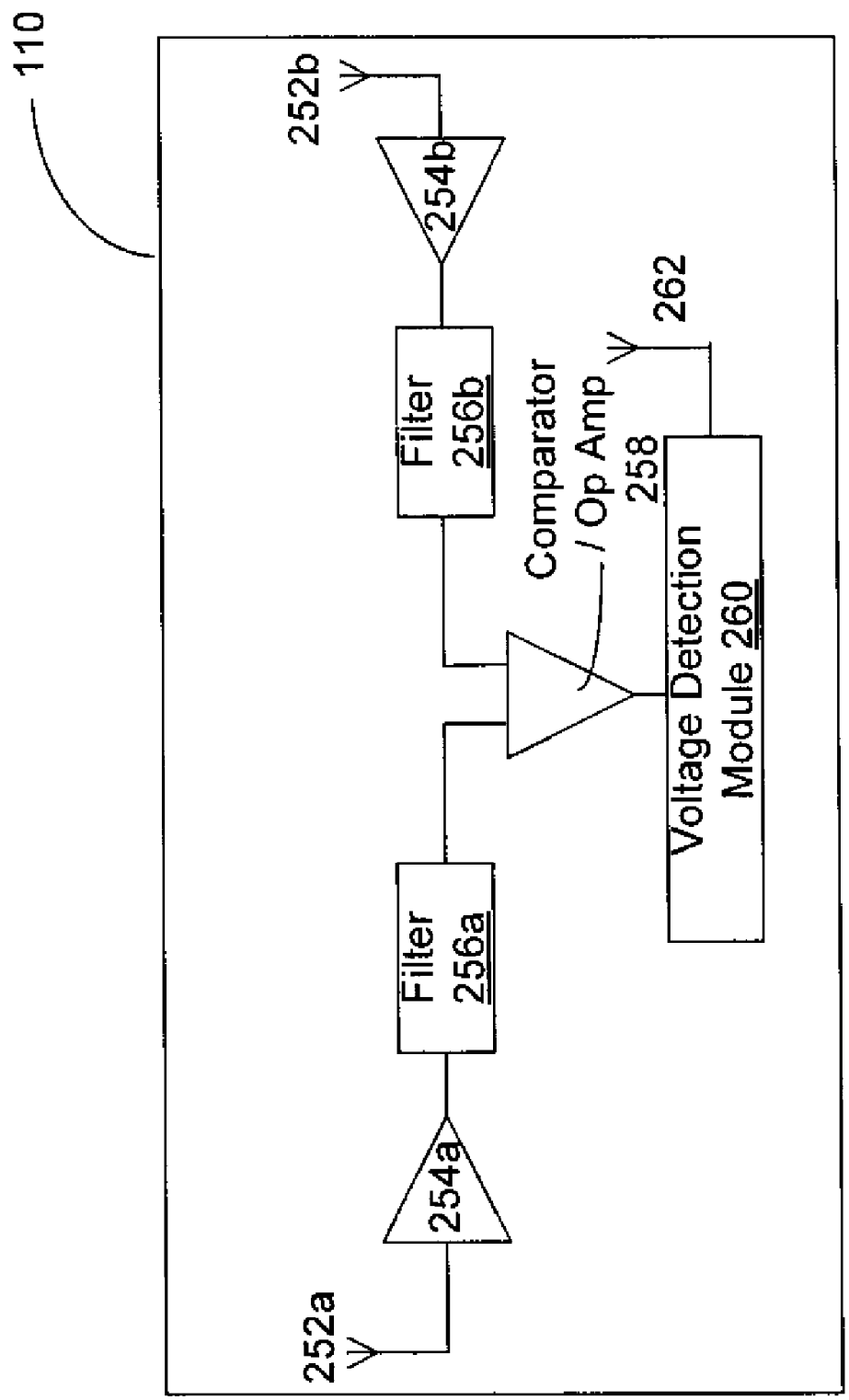
FIG. 2B illustrates an example method for detecting stray voltages, according to an example embodiment of the invention.

FIG. 2B illustrates an example simplified circuit diagram for a voltage detection device 110, according to an example embodiment of the invention. In FIG. 2B, there may be two electric field detection antennas/devices 252a and 252b. The electric field detection antennas/devices 252a and 252b may be positioned substantially parallel to each other in an example embodiment of the invention. However, the electric field detection antennas/devices 252a and 252b may also be positioned at angles to each other as well. Furthermore, there may be more than two electric field detection antennas or devices as well, perhaps three or more in an example embodiment of the invention. The three or more field detection antennas or devices may likewise be positioned substantially parallel to each other or at angles. For example, if there are four electric field detection antennas/devices, two of antennas/devices may be perpendicular to the other two antennas/devices. Many variations in positioning of the electric field detection antennas/devices 252a, 252b may be available.

The electric field detection antennas/devices 252a and 252b may be implemented according to a variety of structures, including a sphere, wire, plate, and yet other mechanical structures. Alternatively or additionally, the electric field detection antennas/devices 252a and 252b may be implemented by wire traces on a PC board, grids, or other conductors.

According to an example embodiment of the invention, the electric field detection antenna/device 252a may be provided at a first position while field antenna or device 252b may be provided at a second position. As an example, the first position for the electric field detection antenna/device 252a may be closer (either horizontally and/or vertically) to monitored equipment or structure while the second position of the electric field antenna/device 252b may further from the monitored equipment or structure. In an example embodiment of the invention, if a streetlight is to be monitored, the electric field detection antenna/device 252a may be closer the mast arm, metal pole, or metal handhold, while the electric field detection antenna/device 252b may be further from the mast arm, metal pole, or metal handhold. Likewise, for a manhole cover, the first position for the electric field detection antenna/device 252a may closer to the manhole cover while the second position for the electric field detection antenna/device 252b may be further from the manhole cover. It will be appreciated that many variations of the positioning for the electric field detection antennas/devices 252a, 252b may be available in example embodiments of the invention. Indeed, the electric field detection antennas/devices 252a, 252b may be provided with a adjustable or swivel mount so that the position of the field antennas/devices 252a, 252b may be adjusted or turned, which may be necessary for minimizing interference signals.

Additionally, as described herein, it will be appreciated that one or both of the electric field detection antennas/devices 252a, 252b may be housed within the voltage detection device 110, or separately from the voltage detection device 110, perhaps as part of the photocontrol device 106 or luminaire 104 or light fixture. Further, one of the field detection antennas/devices 252a, 252b may be formed from part of the monitored equipment or housing. As an example, for a streetlight, one of the field detection antennas/devices 252a, 252b may be the metal pole or another metal structure of the streetlight.

The electric field detection antennas/devices 252a and 252b may be operative to detect an electric fields (E-fields) from current flowing and/or voltage present in or near the respective field antennas/devices 252a and 252b. According to an example embodiment of the invention, the field antennas/devices 252a and 252b may be operative at least in frequency range of interest, which may depend upon the frequency of the supplied power (e.g., 50 Hz-60 Hz). However, it will be appreciated that the field antennas/devices 252a and 252b may be operative with direct current as well.

If the detected E-fields at antennas/devices 252a and 252b are relatively weak signals, they may need to be modified by respective amplifiers 254a and 254b so that further processing can be performed on the detected E-fields. Amplifiers 254a and 254b may be high input impedance amplifiers, according to an example embodiment of the invention. After the E-fields have been detected and amplified, they may be filtered by respective filters 256a and 256b. Filters 256a and 256b may be frequency filters that pass the frequencies of interest. For example, according to an example embodiment of the invention, filters 256a and 256b may pass 60 Hz by blocking below 55 Hz and above 65 Hz. The filters 256a and 256b may also pass the third or other harmonics of 60 Hz. It will be appreciated that the filters 256a and 256b may operate at other frequencies or at direct current as well without departing from embodiments of the invention. Additionally, software filtering that is time sensitive may be utilized to prevent rapid E-field changes due to pedestrian, bus, and/or other external sources.

Still referring to FIG. 2B, a comparator or operational amplifier ("comparator/Op Amp") 258 may examine the difference in potential between the E-fields detected at antennas/devices 252a and 202b. This difference in potential may then be processed and/or examined by the stray voltage alarm module 260 or other signal processing device to determine if it exceeds one or more thresholds. If the difference in potential exceeds one or more thresholds, then the stray voltage alarm module 260 may detect a stray voltage. According to an example embodiment of the invention, time-dependent filtering may be used to ensure that the difference exceeds the one or more thresholds for one or more time periods (e.g., 1 sec, 5 sec, etc.) before the stray voltage alarm module 260 detects the stray voltage. In an example embodiment of the invention, such time-periods may be adjusted based upon expected E-field changes due to pedestrian, bus, and/or other external sources.

The stray voltage alarm module 206 may then generate an appropriate alert of the stray voltage and provide the alert to an antenna 262 for transmission to the photocontrol device 106. The photo-cell device may then transmit the alert to a remote location or user via a wired or wireless network, as described previously. For example, the alert may be via a power-line carrier transmission network or a wireless mesh network. Additionally, the alert may be provided locally (e.g., via blinking light, etc.).

Figure 3:
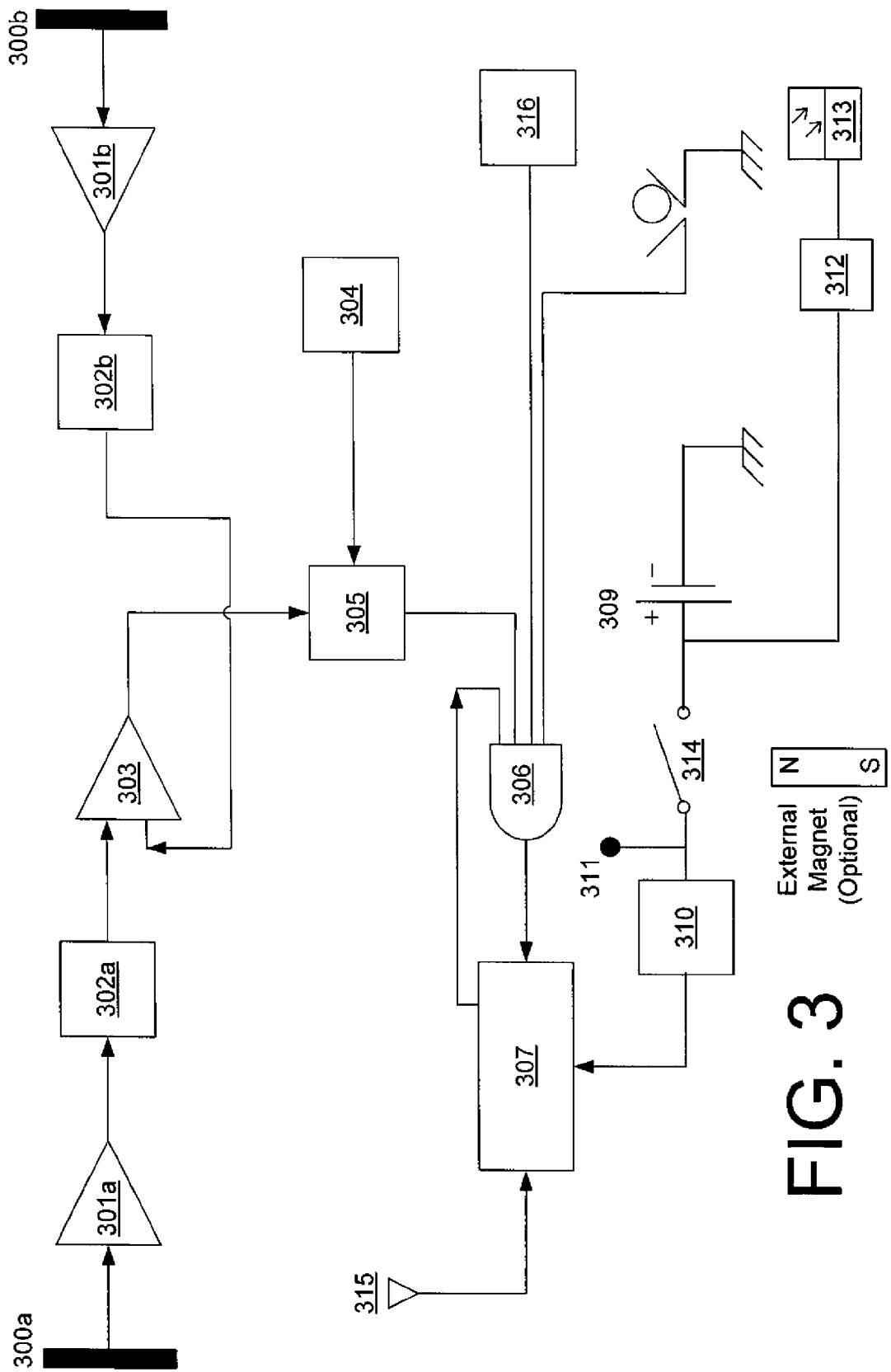
FIG. 3 illustrates a detailed circuit diagram for a stray voltage detection device, according to an example embodiment of the invention.

FIG. 3 illustrates an example detailed circuit diagram for a voltage detection device 110, according to an example embodiment of the invention. Referring to FIG. 3, there may be two or more field detection antennas/devices 300a and 300b for detecting E-fields. Field detection antennas/devices 300a and 300b may be positioned such that antenna/device 300a is located at a first position while antenna/device 300b is located at a second position. According to an example embodiment of the invention, the first position may be closer to the monitored equipment or structure than the second position. Accordingly, the field detection antenna/device 300a may detect a stronger E-field than the field detection antenna/device 300b detects. The E-field strengths detected by the field detection antennas/devices 300a and 300b may be amplified by respective amplifiers 301a and 301b if necessary. The amplifiers 301a and 301b may be high impedance amplifiers, according to an example embodiment of the invention. Following any amplification, the detected E-fields may be filtered by respective filters 302a and 302b. Filters 302a and 302b may be frequency filters, according to an example embodiment of the invention. Filters 302a and 302b may also be analog or digital filters. According to an example embodiment of the invention, where stray voltages may be expected from a 60 Hz power source, the filters 302a and 302b may pass around 60 Hz and block below 55 Hz and above 65 Hz. Likewise, filters 302a and 302b may allow passage at the third or other harmonics of 60 Hz. While filters 302a and 302b may operate as a bandpass filter at 60 Hz, other embodiments of filters 302a and 302b may operate as bandpass filters at other frequencies as well. Alternatively, the filters 302a and 302b may be operable for direct current filtering as well.

Still referring to FIG. 3, an operational amplifier 303 may examine a difference between the detected E-field strengths detected by respective field detection antennas/devices 300a and 300b. The output of the operational amplifier 303 may be provided to a comparator 305, which may be a voltage comparator according to an example embodiment of the invention. The comparator 305 may compare the difference between the detected E-field strengths to a threshold that may be represented by a voltage reference 304. The comparator 305 may then provide a determination of whether the difference between the detected E-field strengths exceeds the threshold to an analog or digital signal processor or micro-controller 306. The processor or micro-controller 306 may receive the output from the comparator 305 and apply filtering, counting, and/or delay as needed to determine whether an alarm or alert condition (e.g., a detected stray voltage) has been triggered. For example, the processor or micro-controller 306 may determine that a stray voltage has been detected if the output of the comparator 305 indicates that the difference in detected E-field strength exceeds the threshold during one or more time periods (e.g., for 1 sec, 5 sec, etc.). In addition, according to an example embodiment of the invention, the processor or micro-controller 306 may also receive information from a tilt switch 308. The tilt switch 308 may send alarm information to the processor or microcontroller 306 when the voltage detection device 110 is tipped a certain number of degrees off horizontal. Likewise, the tilt switch 308 may also be used to detect vibration past a certain magnitude, according to an example embodiment of the invention. Accordingly, the tilt switch 308 may operate as a theft or "knock down" notification, according to an example embodiment of the invention.

According to another embodiment of the invention, one or more sensors 316 may provide information, including information associated with alarms or alerts, to the processor or micro-controller 306. Accordingly, the processor or micro-controller can be alerted upon occurrence of one or more of the following events, including but not limited to: high or low temperature, carbon monoxide, sewer gas, gunshot or other distinct noise, defect in circuitry of the voltage detection device 110, attempts to open the voltage detection device 110 case (e.g., via a light detector or sensor 316 that senses when the case or housing is broken or destroyed), radiation, and environmental conditions.

Any alarms or alerts generated by the processor or micro-controller 306 may be provided to an RF module/transmitter 307. The RF module/transmitter 307 transmits or otherwise communicates the alarms or alerts to the photocontrol device 106 or to another wireless network via the antenna 315. According to an example embodiment of the invention, the antenna 315 may be either internal or external to the voltage detection device 110. According to an alternative embodiment of the invention, the alarms or alerts may not be transmitted until polled by another device, including the photocontrol device 106, a wireless handheld device, or other wireless device present near the voltage detection device 110. As described above, according to yet an alternative embodiment of the invention, the alarms or alerts could also be provided via a wired connection (e.g., power line carrier transmission network) or locally (e.g., a blinking light or other local indication).

As illustrated in FIG. 3, the voltage detection device 110 may operate using a battery 309, according to an example embodiment of the invention. The battery 309 may include a non-rechargeable battery, a rechargeable battery, or both, according to an example embodiment of the invention. Other devices may obtain power using one or more connection terminals 311. A battery status monitor 310 may monitor the life of the battery 309, and may send a signal to the RF module/transmitter 307 when the battery 309 is close to the end of its life or otherwise malfunctioning.

The voltage detection device 110 may further include an optional photovoltaic panel or cell 313 and a photovoltaic monitor and control 312 for the panel or cell 313. The photovoltaic panel or cell 313 may be mounted on an outside surface of the voltage detection device 110, according to an example embodiment of the invention. However, according to an alternative embodiment of the invention, the voltage detection device may include a window to allow sunlight to enter, and the photovoltaic panel or cell 313 may instead be mounted inside the voltage detection device 110. The voltage photovoltaic panel or cell 313 may be operative to recharge the battery 309. It will also be appreciated that according to another example embodiment of the invention, the battery 309 may otherwise be recharged using a clamp-on current transformer. In addition, the battery 309 may also be recharged by an inductive or capacitive pick-up.

According to an embodiment of the invention, the voltage detection device 110 may include an ON/OFF switch 314. The switch 314 and the voltage detection device 110 may be activated when the external magnet is removed from, or added to, the housing port of the voltage detection device 110. This may allow the voltage detection device 110 to be turned on only when installed to save battery 309 life and to prevent false alarms. According to an alternate embodiment of the invention, a switch 314 with an internal magnet may be used and activated by removal of a metal object from outside of the voltage detection device 110. According to another alternative embodiment of the invention, a switch 314 with a proximity sensor may be used and automatically activated by placing the voltage detection device 310 on a metal pole. It will be appreciated that while the voltage detection device 110 of FIG. 3 is battery operated, other embodiments of the voltage detection device may receive power from an external source, at least in part. For example, the voltage detection device 110 may obtain power via the wires 108 of the streetlight 100 and/or a clamp-on current transformer.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A method, comprising:
providing a first antenna at a first location relative to a monitored equipment or structure, wherein the first antenna is operative to detect a first electric field strength at the first location;
providing a second antenna at a second location relative to the monitored equipment or structure, wherein the second antenna is operative to detect a second electric field strength at the second location; and
detecting a stray voltage based at least in part upon the detected first electric field strength and the second electric field strength,
wherein one or both of the first antenna or the second antenna are adjustable such that the respective first location or the second location can be repositioned.

2. The method of claim 1, further comprising:
determining a difference between the first electric field strength and the second electric field strength, wherein the stray voltage is detected based upon the difference between the first electric field strength and the second electric field strength.

3. The method of claim 1, wherein one or both of the first or second antennas comprise a plate, a grid, PC-board traces, or a wire.

4. The method of claim 1, further comprising filtering the detected first electric field strength and the detected second electric field strength.

5. The method of claim 4, wherein the filtering comprises time-dependent filtering.

6. The method of claim 1, wherein the first antenna is substantially parallel or perpendicular to the second antenna.

7. The method of claim 1, wherein an indication of the detected stray voltage is transmitted via a wireless or wired network.

8. The method of claim 7, wherein the wireless network comprises a wireless mesh network formed of a plurality of photocontrol devices.

9. The method of claim 7, wherein the wired network comprises a power-line carrier network.

10. The method of claim 1, wherein the monitored equipment or structure includes (i) a streetlight pole, (ii) mounting hardware associated with the streetlight pole, (iii) a manhole cover, (iv) a fence, (v) a transformer, or (vi) metal or conductive covers or grates.

11. The method of claim 1, wherein one or both of the first or second antennas are provided external to or within (i) a photo-cell associated with a streetlight, or (ii) a fixture head of a streetlight.

12. The method of claim 1, wherein the first antenna or the second antenna is a metal or conductive structure of the monitored equipment or structure.

13. A system, comprising:
a first antenna, wherein the first antenna is operative to detect a first electric field strength at a first location relative to a monitored object;
a second antenna, wherein the second antenna is operative to detect a second electric field strength at a second location relative to the monitored object; and
a signal processing device operative to determine a stray voltage based at least in part on the detected first electric field strength and the second electric field strength,
wherein one or both of the first antenna or the second antenna are adjustable such that the respective first location or the second location can be repositioned.

14. The system of claim 13, further comprising:
an operational amplifier that outputs a difference between the first electric field strength and the second electric field strength; and
a comparator that is operative to determine whether the difference between the first electric field strength and the second electric field strength exceeds a threshold, wherein the signal processing device is operative to determine the stray voltage if the comparator determines that the first electric field strength and the second electric field strength exceeds the threshold.

15. The system of claim 13, further comprising:
a battery for powering at least the signal processing device, and
a photovoltaic panel/cell, clamp-on current transformer, inductive pick-up, or capacitive pick-up for recharging the battery.

16. The system of claim 13, further comprising:
wherein the first antenna, the second antenna, and the signal processing device are provided for a stray voltage detection device, wherein an activation of the stray voltage detection device is magnetically controlled.

17. The system of claim 13, wherein the signal processing device is operative to perform filtering in determining the stray voltage.

18. The system of claim 17, wherein the filtering is time-dependent filtering.

19. The system of claim 13, further comprising:
a radio frequency (RF) transmitter that is operative to transmit an indication of the identified stray voltage to a remote location.

20. The system of claim 19, wherein the RF transmitter is further operative to transmit information associated with one or more of (i) temperature, (ii) gunshot or noise detection, (iii) circuitry defects, (iv) tampering detection, (v) tilt detection, (vi) radiation, and (vii) environmental conditions.

21. The system of claim 13, wherein the monitored object includes (i) a streetlight pole, (ii) mounting hardware associated with the streetlight pole, (iii) a manhole cover, (iv) a fence, (v) a transformer, or (vi) metal or conductive covers or grates.

22. The system of claim 13, wherein one or both of the first or second antennas are provided external to or within (i) a photo-cell associated with a streetlight, or (ii) a fixture head of a streetlight.

23. The method of claim 1, wherein the first antenna, the second antenna, and the signal processing device are provided for a stray voltage detection device, wherein an activation of the stray voltage detection device is magnetically controlled.

24. The method of claim 1, wherein the filtering is performed by at least one filter, and the stray voltage is detected by a signal processing device.

25. A method, comprising:
providing a first antenna at a first location relative to a monitored equipment or structure, wherein the first antenna is operative to detect a first electric field strength at the first location;
providing a second antenna at a second location relative to the monitored equipment or structure, wherein the second antenna is operative to detect a second electric field strength at the second location;
filtering the detected first electric field strength and the detected second electric field strength, wherein the filtering comprises time-dependent filtering; and
detecting a stray voltage based at least in part upon the filtered first electric field strength and the filtered second electric field strength.

26. The method of claim 25, further comprising:
determining a difference between the first electric field strength and the second electric field strength, wherein the stray voltage is detected based upon the difference between the first electric field strength and the second electric field strength.

27. The method of claim 25, wherein the first antenna is substantially parallel or perpendicular to the second antenna.

28. The method of claim 25, wherein the monitored equipment or structure includes (i) a streetlight pole, (ii) mounting hardware associated with the streetlight pole, (iii) a manhole cover, (iv) a fence, (v) a transformer, or (vi) metal or conductive covers or grates.

29. The method of claim 25, wherein one or both of the first or second antennas are provided external to or within (i) a photo-cell associated with a streetlight, or (ii) a fixture head of a streetlight.

30. A system, comprising:
a first antenna, wherein the first antenna is operative to detect a first electric field strength at a first location relative to a monitored object;
a second antenna, wherein the second antenna is operative to detect a second electric field strength at a second location relative to the monitored object; and
a signal processing device operative to determine a stray voltage based at least in part on the detected first electric field strength and the second electric field strength, wherein the signal processing device is operative to perform filtering in determining the stray voltage, wherein the filtering is time-dependent filtering.

31. The system of claim 30, further comprising:
an operational amplifier that outputs a difference between the first electric field strength and the second electric field strength; and
a comparator that is operative to determine whether the difference between the first electric field strength and the second electric field strength exceeds a threshold, wherein the signal processing device is operative to determine the stray voltage if the comparator determines that the first electric field strength and the second electric field strength exceeds the threshold.

32. The system of claim 30, wherein the first antenna is substantially parallel or perpendicular to the second antenna.

33. The system of claim 30, wherein the monitored object includes (i) a streetlight pole, (ii) mounting hardware associated with the streetlight pole, (iii) a manhole cover, (iv) a fence, (v) a transformer, or (vi) metal or conductive covers or grates.

34. The system of claim 30, wherein one or both of the first or second antennas are provided external to or within (i) a photo-cell associated with a streetlight, or (ii) a fixture head of a streetlight.

* * * * *